United States Patent [19]
Hobson et al.

[11] Patent Number: 5,815,521
[45] Date of Patent: *Sep. 29, 1998

[54] SEMICONDUCTOR LASER WITH LOW BEAM DIVERGENCE

[75] Inventors: William Scott Hobson, Summit; Daryoosh Vakhshoori, Chatham Township, Morris County, both of N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 906,655

[22] Filed: Aug. 7, 1997

Related U.S. Application Data

[63] Continuation of Ser. No. 602,427, Feb. 16, 1996, abandoned.

[51] Int. Cl.⁶ .............................. H01S 3/19; G02B 6/10
[52] U.S. Cl. .............................. 372/45; 372/50; 385/129
[58] Field of Search ................................ 372/45, 44, 43, 372/19, 50; 359/179, 160, 341, 344; 385/129–132, 14

[56] References Cited

U.S. PATENT DOCUMENTS

| | | | |
|---|---|---|---|
| 4,468,765 | 8/1984 | Hensel et al. | 455/612 |
| 4,941,146 | 7/1990 | Kobayashi | 372/45 |
| 5,084,880 | 1/1992 | Esterowitz et al. | 372/6 |
| 5,088,099 | 2/1992 | Chen et al. | 372/45 |
| 5,289,484 | 2/1994 | Kayakawa | 372/45 |
| 5,395,792 | 3/1995 | Ikawa et al. | 437/129 |
| 5,432,809 | 7/1995 | Grodzinski et al. | 372/45 |
| 5,457,562 | 10/1995 | Tremblay | 359/341 |
| 5,491,711 | 2/1996 | Mand et al. | 372/49 |

OTHER PUBLICATIONS

Patent Abstracts of Japan, vol. 017, No. 128, (E–1333), 18 Mar. 1993 & JP 04 303986 A, (Mitsubishi Electric Corp), 27 Oct. 1992.

Patent Abstracts of Japan, vol. 003, No. 071 (E–118), 20 Jun. 1979 & JP 54 051391 A, (Toshiba Corp.), 23 Apr. 1979.

Patent Abstracts of Japan, vol. 095, No. 002, 31 Mar. 1995 & JP 06 318754 A, (Matsushita Electric Ind Co Ltd.), 15 Nov. 1994.

"Spot Size Expansion for Laser–to–Fiber Coupling Using an Integrated Multimode Coupler", by J. Buus, *Journal of Lightwave Technology*, vol. 11, No. 4, Apr. 1993.

"980 nm Spread Index Laser With Strain Compensated InGaAS/GaAsP/InGaP and 90% Fibre Coupling Efficiency", by D. Vakhshoori et al., *Electronics Letters*, vol. 32, No. 11, 23 May 1996, pp. 1007–1008, XP 000599136.

"Theoretical Investigation Investigation on Semiconductor Lasers with Passive Waveguides", by S. t. Yen et al., *IEEE Journal of Quantum Electronics*, vol. 32, No. 1, XP 000548674, 1 Jan. 1996, pp. 4–13, New York.

"High–Temperature Reliability of Aluminum–free 980 nm and 808 nm Laser Diodes", by J. Diaz et al., *Compound Semiconductors 1995, Proceedings of the 22nd International Symposium on Compound Semiconductors*, Cheju Island, Korea, Aug. 28 –Sep. 2, 1995, pp. 1041–1046, XP000590398.

*Primary Examiner*—John D. Lee
*Assistant Examiner*—Quyen Phan Leung
*Attorney, Agent, or Firm*—Eugen E. Pacher

[57] ABSTRACT

The inventive III/V semiconductor lasers comprise mode-shaping layers disposed in the upper and lower cladding regions, respectively, and having larger refractive index than the adjoining cladding material. Incorporation of the mode-shaping layers can significantly spread the mode structure of the laser, with attendant reduction of beam spreading. Preferred embodiments are Al-free III/V semiconductor lasers. Especially preferred are such lasers that do not have quaternary III/V semiconductor material between active region and substrate, for improved heat removal.

10 Claims, 4 Drawing Sheets

SEMICONDUCTOR LASER WITH LOW BEAM DIVERGENCE

This application is a continuation of application Ser. No. 08/602,427, filed on Feb. 16, 1996, now abandoned.

FIELD OF THE INVENTION

This invention pertains to the field of semiconductor lasers.

BACKGROUND OF THE INVENTION

Semiconductor lasers are well known, and have already found a variety of commercial applications, from compact disk players to optical fiber communication systems.

As those skilled in the art know, semiconductor lasers generally have an output beam of elliptical cross section and considerable spread in at least one direction, typically the transverse direction (i.e., the direction that is perpendicular both to the longitudinal axis of the laser and to the layer structure of the laser). This beam spread is a disadvantage at least for applications that require coupling of the laser output beam into the core of an optical fiber, since it typically results in considerable coupling loss. Thus, it would be highly desirable to have available semiconductor lasers that have low beam divergence. This application discloses such lasers.

SUMMARY OF THE INVENTION

In a broad aspect the invention is embodied in improved semiconductor lasers. More specifically, the invention is embodied in an article (e.g., an optical fiber communication system, or an Er-doped fiber amplifier) that comprises a semiconductor laser. The laser comprises a semiconductor layer structure (typically all semiconductor layers are III/V semiconductor layers), and contacts that facilitate flowing a current through the layer structure. The layer structure comprises at least one layer of a first conductivity type, at least one layer of a second conductivity type, and an active region (typically comprising material that is not intentionally doped) between the layers of first and second conductivity type. The layer structure is selected to act as a waveguide for laser radiation of wavelength $\lambda$, the waveguide comprising a lower cladding region, an upper cladding region, and a core region between the upper and lower cladding regions. The core region comprises at least a portion of the active region and has an effective refractive index at wavelength $\lambda$ that is larger than the refractive index at wavelength $\lambda$ of at least a portion of each of the lower and upper cladding layers, typically the portion adjacent to the core.

Significantly, each of the lower and upper cladding regions comprises at least one mode-shaping layer that is spaced apart from the core region and has a larger refractive index at wavelength $\lambda$ than the portions of the respective cladding region that are contiguous with the mode-shaping layer. The refractive index of the mode-shaping layers and the spacing of the mode-shaping layers from the core region are selected such that a mode diameter of the laser is increased, as compared to the corresponding mode diameter of a comparison laser that is identical to the laser except that the former does not have the mode-shaping layers, and such that a transverse laser mode is stable.

In currently preferred embodiments the semiconductor layer structure is Al-free and does not comprise quaternary III/V semiconductor material.

Exemplarily, a laser according to the invention is a 980 nm pump laser for an Er-doped fiber amplifier (EDFA). We will refer to lasers according to the invention as "Spread-Index" (SPIN) lasers.

DETAILED DESCRIPTION OF AN EXEMPLARY EMBODIMENT

Figure 1:
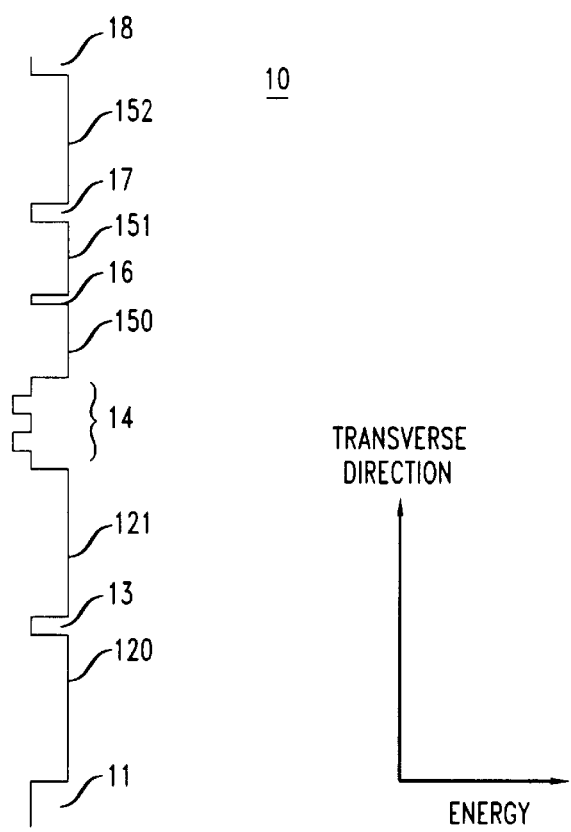
FIG. 1 schematically shows the conduction band edge of the layer structure of an exemplary SPIN laser as a function of the transverse coordinate.

The layer structure of an exemplary SPIN laser is shown in Table I, and FIG. 1 schematically shows the conduction band edge of the layer structure (10). Such representation is conventional and does not require explanation.

TABLE 1

| material | doping | thickness |
| --- | --- | --- |
| GaAs cap layer | $p^{++}$ | — |
| InGaP | p | 1.3 $\mu$m |
| GaAs mode-shaping layer | p | 75 nm |
| InGaP | p | 0.3 $\mu$m |
| GaAs etch-stop layer | p | 2 nm |
| InGaP | p | 0.2 $\mu$m |
| GaAs/InGaAs active region | undoped | 3 × 20 nm/2 × 7 nm |
| InGaP | n | 0.5 $\mu$m |
| GaAs mode-shaping layer | n | 75 nm |
| InGaP | n | 1.3 $\mu$m |
| GaAs substrate | $n^+$ | — |

In FIG. 1, numerals 11, 120 and 121 refer respectively to the $n^+$ GaAs substrate, and the lower and upper portion of the lower (n InGaP) cladding layer. Numeral 14 refers to the (not intentionally doped) active region which contains two strained 7 nm InGaAs quantum wells and 20 nm GaAs barrier layers. Numerals 150, 151 and 152 refer to portions of the (p InGaP) upper cladding, and 18 refers to the $p^{++}$ GaAs cap layer. Numeral 16 refers to an optional (2 nm p GaAs) etch stop layer that serves to define the depth of the etched mesa in conventional manner. Numerals 13 and 17 refer to the mode-shaping layers (75 nm n and p GaAs, respectively), each spaced 0.5 $\mu$m from the active region. Alternatively, the mode-shaping layers could be GaAsP layers.

The layer structure can be grown by any appropriate growth technique (e.g., MOCVD) in conventional fashion, and can be processed in conventional fashion into a stripe geometry laser. Exemplarily the mesa width is 3 $\mu$m. Contacts can be provided in conventional fashion.

The layer structure is selected to serve as a waveguide for the laser radiation of wavelength $\lambda$ (exemplarily 980 nm). In particular, active region 14 has an effective refractive index larger than the indices of both adjacent layers (121 and 150).

The active region thus serves as the core of the waveguide, layers 121 and 120 serve as the lower cladding, and layers 150, 151 and 152 serve as the upper cladding.

Figure 2:
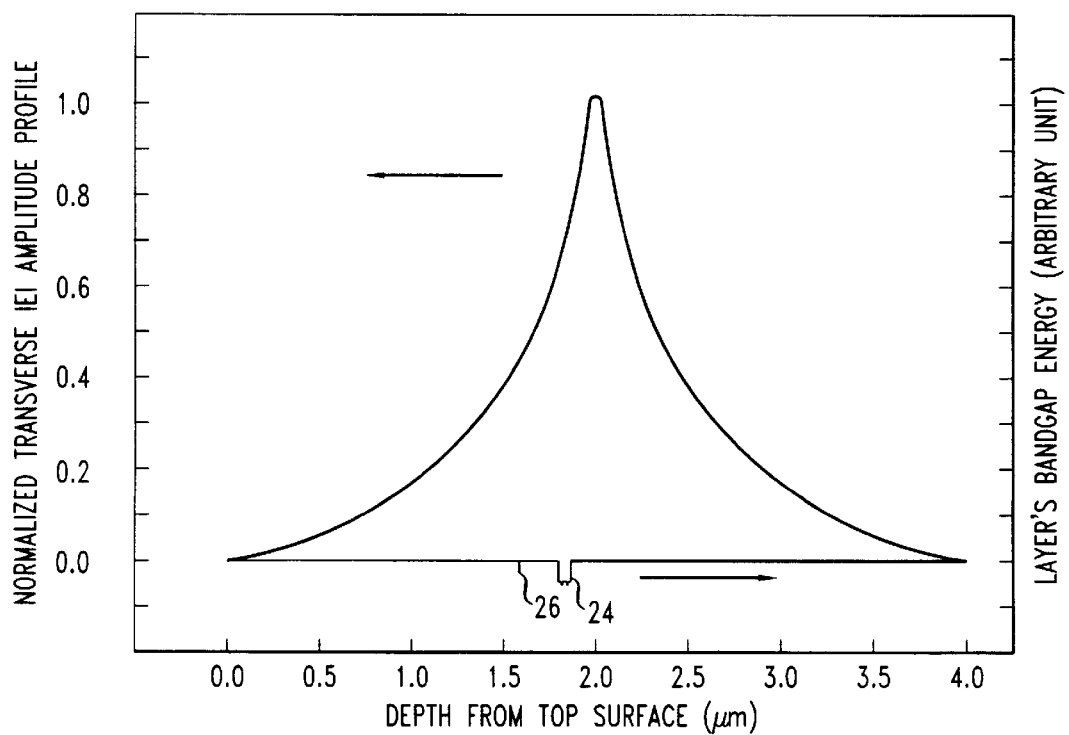
FIGS. 2 and 3 show the bandgap energy profile and electric field distribution of an exemplary prior art laser, and of the exemplary SPIN laser, respectively.
Figure 3:
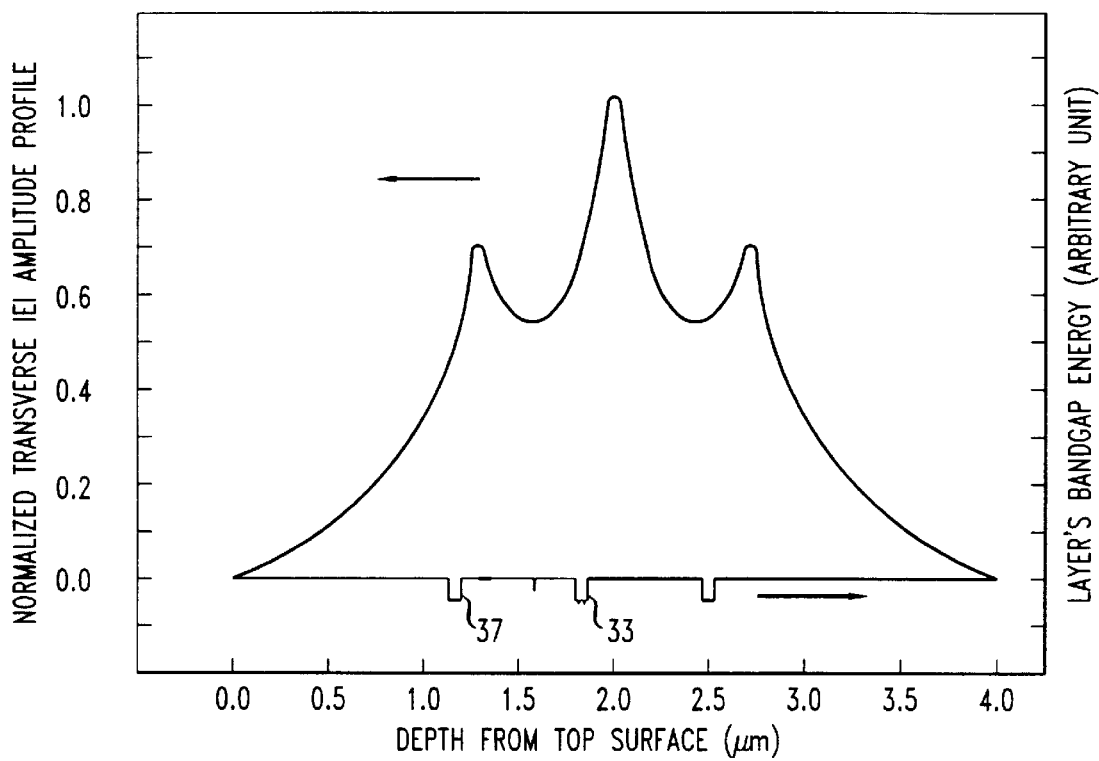

Those skilled in the art know that, in the absence of layers 13 and 17, the fundamental laser mode would have a single peak centered over the core region, substantially as shown in FIG. 2. The figure also shows the bandgap energy as a function of depth from the top surface, with features 24 and 26 corresponding to active region 14 and etch stop layer 16, respectively. Provision of the mode-shaping layers 13 and 17 changes the shape of the laser modes, including that of the fundamental mode. This is shown in FIG. 3, which shows the normalized electric field amplitude profile and the bandgap energy, both as a function of depth from the top surface. Features 33 and 37 correspond to layers 13 and 17, respectively.

The exemplary SPIN laser under discussion supports three modes, but the third order mode has very small overlap with the gain region and can be ignored. The fundamental mode has a peak at the active region and two subsidiary peaks at the mode-shaping layers. The computed active region confinement factor for the fundamental mode is 2.37%. The second order mode is also peaked at the active region, with computed confinement factor of 2.21%.

The thickness of the mode-shaping layers, their respective spacing from the active region and their respective refractive index are advantageously selected such that, in addition to expanding the fundamental mode into the cladding layers, the fundamental mode has higher confinement factor in the active region than the second order mode, and hence dominates the lasing action for all currents. Those skilled in the art will be readily able to determine appropriate mode-shaping layer thickness, spacing and refractive index, typically by computer simulation, using one of several widely available programs.

As already disclosed, appropriately sized and positioned mode-shaping layers will bring about the expansion of the transverse (fundamental) mode, as compared to a comparison laser without the mode-shaping layers, resulting in a larger beam spot (lower power density at the emission facet), and narrower far field.

Figure 4:
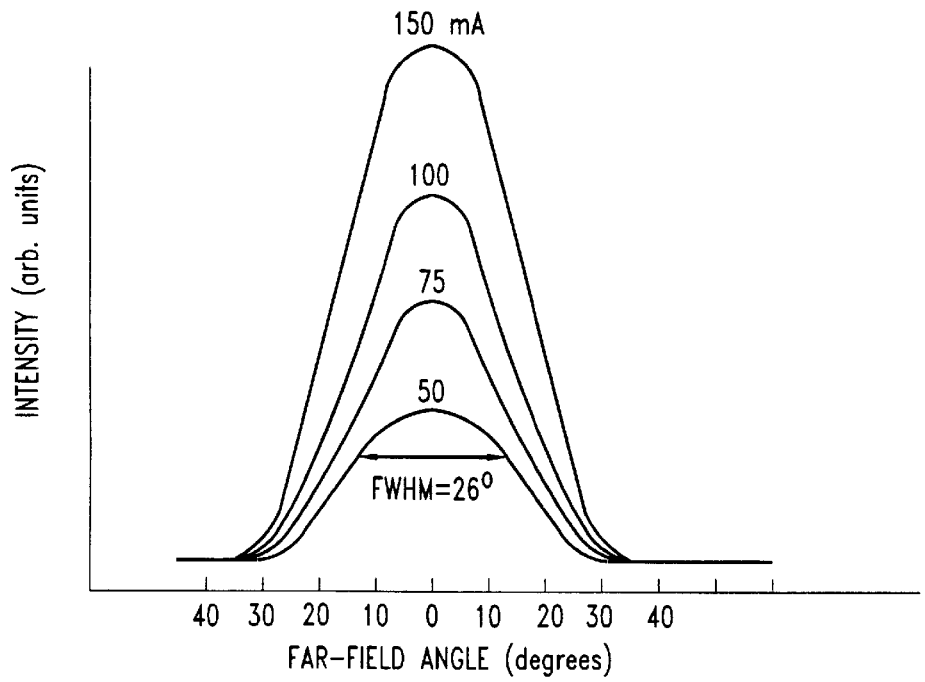
FIG. 4 shows data on intensity vs. far field angle, for various values of drive current.

FIG. 4 shows exemplary results on intensity as a function of far-field lateral angle, for several values of drive current. The measured FWHM (full width at half maximum) lateral far-field angle was 26°. The corresponding laser without mode-shaping layers has FWHM lateral far field angle of 34°. The transverse far-field angle was 10°, corresponding to 3 $\mu$m mesa width. The laser had 29 mA threshold current and 0.78 W/A slope efficiency.

For a given beam spot ellipticity, the coupling fiber can be optimized by appropriate choice of fiber numerical aperture. The optimal fiber numerical aperture (NA) is the geometric mean of the transverse and lateral numerical apertures, as is known to those skilled in the art.

Figure 5:
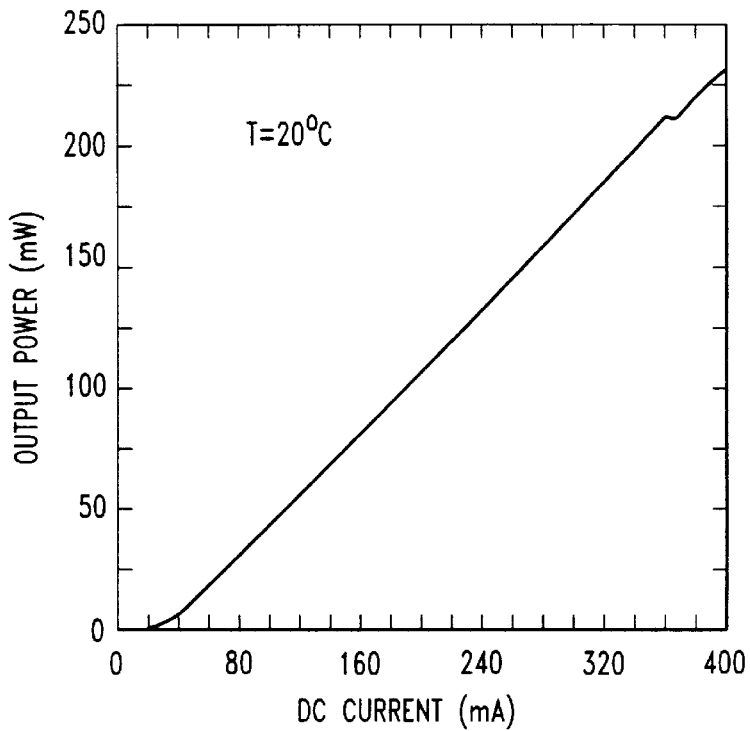
FIG. 5 shows data on output power vs. drive current, for an exemplary SPIN laser.

FIG. 5 shows exemplary data on laser output power ($\lambda$=980 nm) as a function of DC drive current, for a SPIN laser substantially as described.

The layer structure of the above described exemplary laser is free of Al-containing semiconductor layers. This is advantageous, in view of the known propensity of Al for forming Al-oxide. Furthermore, the layer structure contains only binary and ternary semiconductor III/V material. This is advantageous, especially for the layers between active region and substrate, in view of the substantially higher thermal conductivity (typically about 4 times higher) of ternary III/V material over quaternary III/V material. A laser design that is free of quaternary semiconductor material in the heat flow path thus can have more effective heat removal, and potentially can operate at higher power levels.

In the alternative, it may be possible to achieve improved laser reliability by omitting GaAs from the layer structure, and SPIN lasers wherein InGaAsP layers replace the GaAs layers are contemplated.

Figure 6:
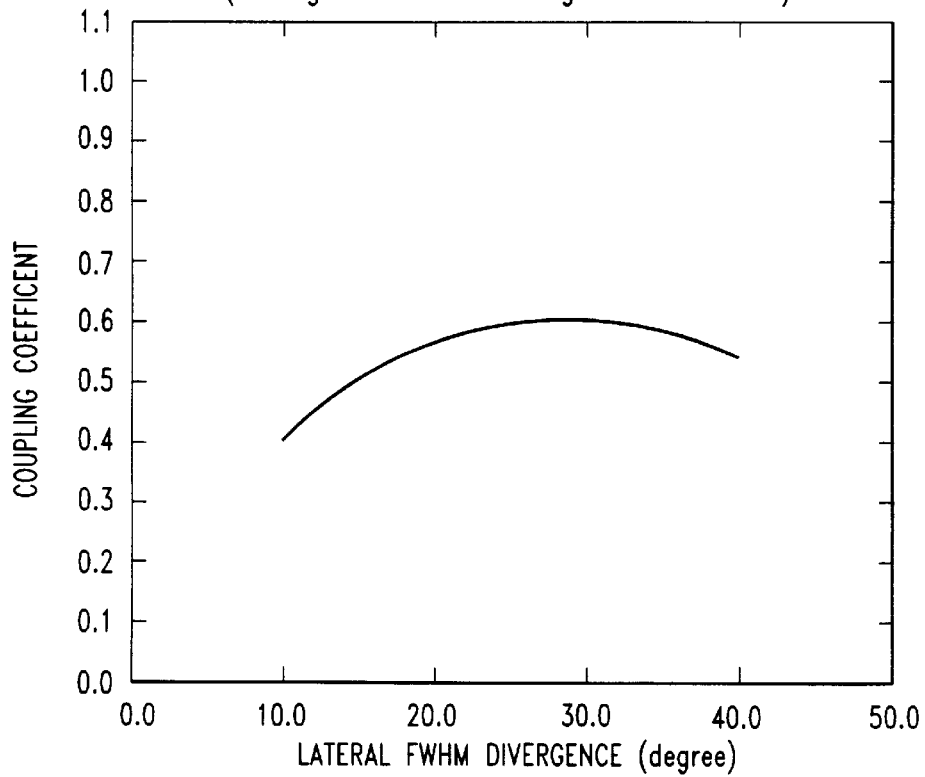
FIG. 6 shows an exemplary computed curve of coupling coefficient vs. lateral divergence of the laser beam.

FIG. 6 shows an exemplary computed curve of coupling coefficient vs. lateral FWHM divergence of the laser beam, with 10° transverse divergence, for coupling into a lensed fiber of NA=0.4. As can be seen, theory predicts 63% coupling efficiency for 26° lateral FWHM divergence. This is in good agreement with the experimentally observed value of 65% for coupling to a lensed fiber with (non-optimal) 0.4 NA. Use of a fiber with optimal NA of about 0.3 is expected to yield>75% coupling efficiency. This would be about a factor of two better than the coupling efficiency of lasers of conventional separate confinement heterostructure design.

Figure 7:
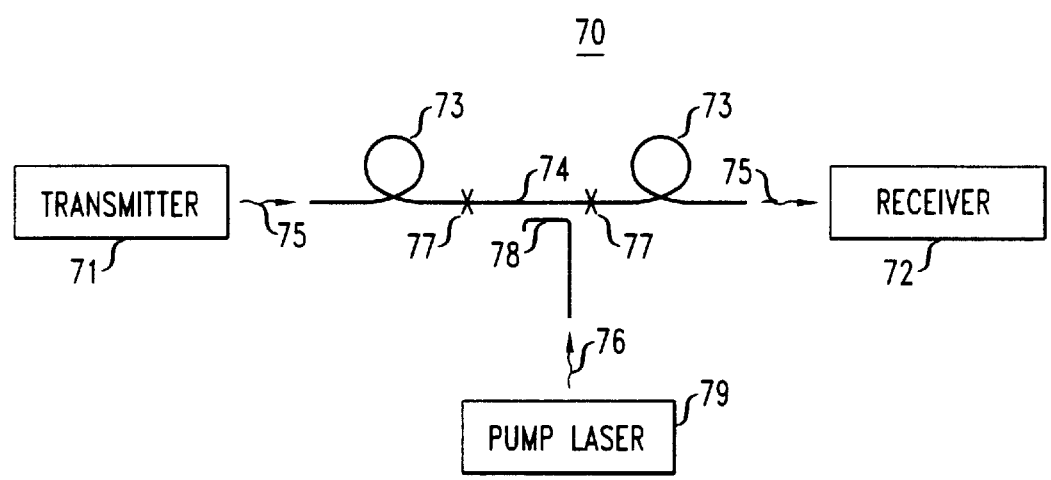
FIG. 7 schematically shows an optical fiber communication system according to the invention.

FIG. 7 schematically depicts an exemplary article according to the invention, namely, an optically amplified optical fiber communication system 70. The system comprises transmitter 71, receiver 72, transmission fiber 73, and rare earth doped (e.g., Er-doped) amplifier fiber 74. Numerals 75 refer to signal radiation and 76 refers to pump radiation. The amplifier fiber is signal-transmissively coupled to the transmission fibers, e.g., by means of conventional fusion splices 77. Conventional coupler 78 saves to couple pump radiation 76 into the amplifier fiber, and pump laser 79 provides the pump radiation. The pump laser is a laser according to the invention, with low beam divergence.

The invention claimed is:

1. An article comprising a semiconductor laser, said laser comprising a semiconductor layer structure on a substrate, and contacts that facilitate flowing a current through the layer structure;

the layer structure comprises at least one layer of a first conductivity type, at least one layer of a second conductivity type, and an active region between said layers of first and second conductivity type;

the layer structure is selected to form a waveguide for laser radiation of wavelength $\lambda$, said waveguide comprising a lower cladding region, an upper cladding region, and a core region between said lower and upper cladding regions, with the core region comprising at least a portion of the active region and having an effective refractive index at wavelength $\lambda$ that is larger than the refractive index at wavelength $\lambda$ of at least a portion of each of the lower and upper cladding layers;

characterized in that each of said lower and upper cladding regions comprises a single mode-shaping layer having a thickness, being spaced apart from the core region and having a larger refractive index at wavelength $\lambda$ than the portions of the respective cladding region that are contiguous with the mode-shaping layer, the refractive index and spacing from the core region of the respective mode-shaping layers selected such that a laser mode diameter is increased and a transverse laser mode is stable, said spacing of the respective mode shaping layers from the core region being greater than the thickness of the respective mode-shaping layers.

2. Article according to claim 1, wherein said layer structure is a III/V semiconductor layer structure.

3. Article according to claim 2, wherein said III/V semiconductor layer structure does not comprise an Al-containing semiconductor layer.

4. Article according to claim 2, wherein said III/V semiconductor layer structure does not comprise a quaternary III/V semiconductor layer disposed between said active region and said substrate.

5. Article according to claim 2 wherein said mode-shaping layers comprise material selected from the group consisting of GaAs and GaAsP.

6. Article according to claim 5, wherein said laser is a mesa-type laser, and one of said mode-shaping layers also serves as etch-stop layer for mesa etching.

7. Article according to claim 2, further comprising an optical fiber disposed for receiving an output radiation of the laser.

8. Article according to claim 7, wherein said optical fiber has a numerical aperture of about 0.3.

9. Article according to claim 7, wherein the article is an optical fiber amplifier comprising a rare-earth-doped amplifier fiber and means for coupling pump radiation into said amplifier fiber, said means comprising said optical fiber, said laser providing said pump radiation.

10. Article according to claim 9, wherein the article is an optical fiber communication system comprising a transmitter, a receiver, and an optical fiber transmission path signal-transmissively connecting said transmitter and receiver, wherein said transmission path comprises said optical fiber amplifier.

* * * * *